United States Patent [19]

Shih et al.

[11] Patent Number: 4,937,828
[45] Date of Patent: Jun. 26, 1990

[54] HIGH SPEED PARALLEL CRC DEVICE FOR CONCATENATED DATA FRAMES

[75] Inventors: Hubert Shih, Adelphi; Brian W. Kroeger, Ellicott City; Robert J. Delcoco, Columbia, all of Md.

[73] Assignee: Westinghouse Electric Corp., Pittsburgh, Pa.

[21] Appl. No.: 267,404

[22] Filed: Nov. 4, 1988

[51] Int. Cl.⁵ ............................................. G06F 00/00
[52] U.S. Cl. ................................. 371/37.1; 371/37.6
[58] Field of Search ................... 371/37.1, 37.2, 37.3, 371/37.4, 37.5, 37.6, 37.7, 37.9, 38.1, 39.1

[56] References Cited

U.S. PATENT DOCUMENTS

| | | | |
|---|---|---|---|
| 4,276,647 | 6/1931 | Thacker | 371/37.6 |
| 4,454,600 | 6/1984 | LeGresley | 371/37.6 |
| 4,498,174 | 2/1985 | LeGreskey | 371/37.6 |
| 4,646,312 | 2/1987 | Goldsburg | 371/37.6 |
| 4,780,875 | 10/1988 | Sakai | 371/37.6 |

OTHER PUBLICATIONS

Kong, Vivian, "Implementaton of Serial/Parallel CRC Using PAL Devices," Systems Design Handbook, 2nd Ed., 1985, pp. 4–32–4–54.

Primary Examiner—Michael R. Fleming
Attorney, Agent, or Firm—W. G. Sutcliff

[57] ABSTRACT

A cyclic redundancy check generator for a high speed data bus is capable of outputting frames of data and cyclic redundancy check bits concatenated together without any additional space or time delay between frames while operating at a normal clock speed. Data to be transmitted is parallel loaded into series-connected registers via multiplexers connected between the registers. The multiplexers also provide parallel loading of the cyclic redundancy check bits for a frame of data from a look-ahead cyclic redundancy check logic circuit. The output of the logic circuit is also connected to a cyclic redundancy check register. The logic circuit has inputs connected to the final series-connected data register and the cyclic redundancy check register. The logic circuit operates on portions of words in a frame of data and when the last portion of the last word has been processed, the output from the logic circuit is selected by the multiplexers and then shifted out of the data registers immediately behind the last word of the frame. After the last portion of the cyclic redundancy check bits have been output from the final register, the first word in the next frame is parallel loaded into the registers and the cyclic redundancy check register is initialized so that processing of the first word of the next frame can begin in the logic circuit.

10 Claims, 8 Drawing Sheets

HIGH SPEED PARALLEL CRC DEVICE FOR CONCATENATED DATA FRAMES

BACKGROUND OF THE INVENTION

1. Field of the Invention

The present invention is related to a cyclic redundancy check (CRC) generator and checker and, more particularly, to a CRC generator using parallel look-ahead logic to generate CRC bits at high speed.

2. Description of the Related Art

Many forms of digital data transfer use cyclic redundancy (CRC) codes for error detection. Using 16 CRC bits for each frame of data, a frame may contain thousands of bits and yet all of the following types of errors can be detected: single bit and double-bit errors, any odd number of errors and many burst errors including all which have a length of less than 16 bits, provided certain rules are followed in generating the CRC bits.

The CRC bits are generated by performing manipulations on the data which are equivalent to dividing the data by a generator polynomial using modulo 2 arithmetic. Error detection using CRC bits is well known in the art and several standard generator polynomials have been defined. For example, the Consultative Committee for International Telegraph and Telephone (CCITT) has established a standard using the generator polynomial $X^{16}+X^{12}+X^5+1$. This CRC standard has been adopted by the Society of Automotive Engineers (SAE) Avionics Systems 2 section in their High Speed Ring Bus (HSRB) standard AS4074.2. The HSRB standard includes operation at 80 MHz with the data frames and CRC bits or frame check sequences (FCSs) concatenated.

No single conventional CRC generator is capable of operating at 80 MHz to produce concatenated frames and FCSs. In order to obtain data in the format required by SAE-HSRB, a conventional CRC generator would have to operate at a much higher clock speed or two overlapped CRC generators would have to be used.

SUMMARY OF THE INVENTION

An object of the present invention is to provide a cyclic redundancy check (CRC) generator for outputting successive frames of data appended with CRC bits concatenated without any additional space or time delay between frames.

Another object of the present invention is to obtain concatenated frames of data with appended CRC bits from a CRC generator without introducing any additional delay in the data path.

Yet another object of the present invention is to provide a CRC generator capable of interfacing with four, eight, sixteen or more bits of input data paths.

A further object of the present invention is to provide a cyclic redundancy check (CRC) generator capable of outputting concatenated frames of data and CRC bits while operating at a normal clock rate and using only a single logic circuit.

The above objects are attained by providing a cyclic redundancy check generator for generating cyclic redundancy check bits for each frame of input data composed of a plurality of words, the generator comprising data register means, having a first parallel input operatively connected to receive the input data and having a second parallel input and a parallel output, for storing transmit data to be output from the cyclic redundancy check generator; cyclic redundancy check register means, having a parallel input and a parallel output, for storing cyclic redundancy check bits; and a logic circuit having an input operatively connected to the parallel outputs of the data register means and the cyclic redundancy check register means and an output operatively connected to the second parallel input of the data register means and the parallel input of the cyclic redundancy check register means. The logic circuit generates updated cyclic redundancy check bits in parallel in dependence upon the transmit data from the data register means and the cyclic redundancy check bits from the cyclic redundancy check register means. The logic circuit also supplies the updated cyclic redundancy check bits to the cyclic redundancy check register means for storage therein. The updated cyclic redundancy check bits are also supplied to the data register means for storage therein after generating the updated cyclic redundancy check bits for the last word in each frame of the input data. The data register means outputs the updated cyclic redundancy check bits as the transmit data after outputting the last word in each frame of the input data. The cyclic redundancy check register means includes initialization means for resetting the cyclic redundancy check bits stored therein when a first word in a new frame is received by the data register means.

Preferably, the data register means includes a plurality of multiplexers and data registers connected in series, each multiplexer having an output connected to the input of a corresponding register and an input receiving portions of the input data and of the cyclic redundancy check bits, each portion containing at least four bits received in parallel. Each of the data registers output transmit data and all but one of the data registers output the transmit data to a following multiplexer. The final data register provides the output from the cyclic redundancy check generator. One of the multiplexers receives only the portions of the input data and the cyclic redundancy check bits. The at least one remaining multiplexer also receives the transmit data from a preceding one of data registers.

BRIEF DESCRIPTION OF THE DRAWINGS

FIG. 4(A and 4B) diagram for the CRC generator illustrated in FIG. 3;

DESCRIPTION OF THE PREFERRED EMBODIMENT

Figure 1:
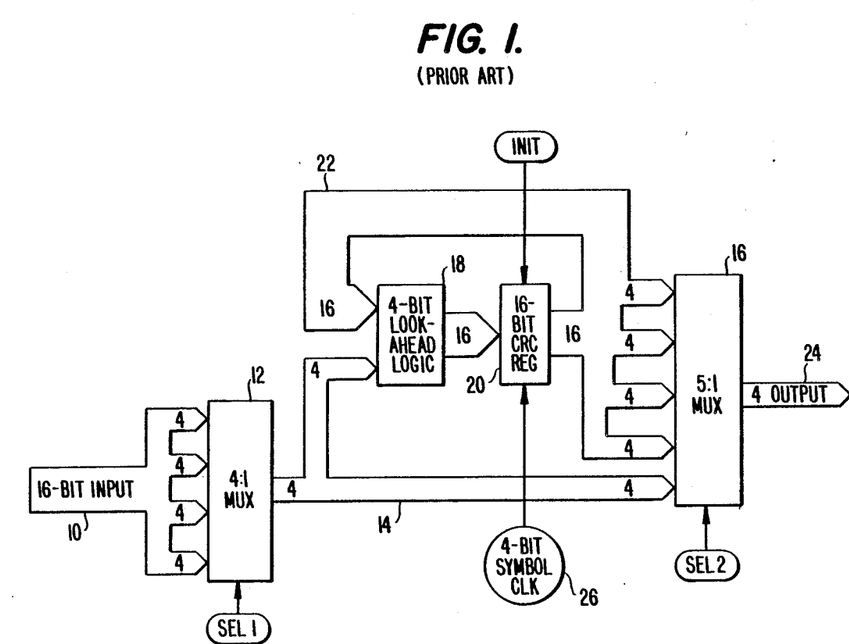
FIG. 1 is a block diagram of a conventional four-bit parallel implementation of a 16-bit CRC generator.

There are many implementations of cyclic redundancy check (CRC) generators. Several implementations using programmable array logic (PAL) are described in "Implementation of Serial/Parallel CRC Using PAL Devices" by Vivian Kong in *System Design Handbook*, 2nd Ed., 1985. This article refers to several examples of popular CRC generator polynomials including CRC-CCITT. An example of a conventional four-bit parallel implementation of a 16-bit CRC generator based upon the parallel CRC generator disclosed in the *System Design Handbook* article is illustrated in FIG. 1. Sixteen bits of parallel input are supplied by data supply means 10 to a four-to-one multiplexer 12. One of the four-bit nibbles of the 16-bit input word is selected by select signal SEL1 and output on transmit data bus 14 to a five-to-one multiplexer 16. The data on the transmit bus 14 is also supplied to four-bit look-ahead logic 18. The four-bit look-ahead logic is determined for a specific CRC generator polynomial using the technique described in Appendix A of the *System Design Handbook* article. The look-ahead logic 18 uses previously calculated CRC bits stored in a 16-bit CRC register 20 provided by a CRC bus 22. The CRC bits are updated in the four-bit look-ahead logic 18 and output for storage in the CRC register 20. Then, the next four-bit nibble of a word is selected by multiplexer 12 and the process is repeated until the last nibble of the last word of the frame has been processed in the four-bit look-ahead logic 18.

Before another frame can be input to the four-bit look-ahead logic 18, the CRC register 20 outputs the CRC bits to the five to one multiplexer 16 which selects one four-bit nibble of the word for output on output bus 24. Then, the CRC register 20 must be initialized to all zeros or all ones before the first nibble of the first word of the next frame is output from the four-to-one multiplexer 12.

Figure 2A:
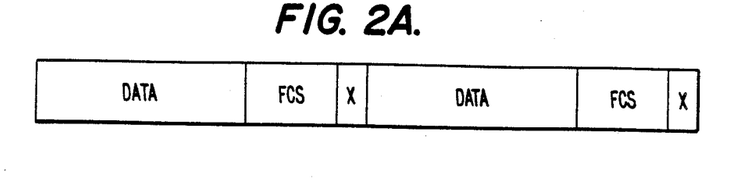
FIGS. 2A and 2B are frame formats output by the circuits illustrated in FIGS. 1 and 3, respectively.
Figure 2B:
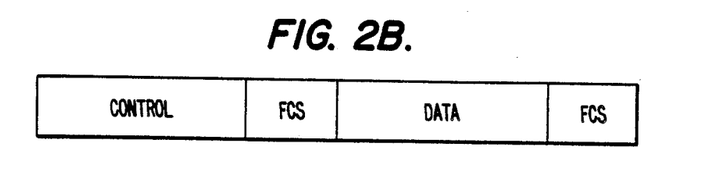

The timing for the conventional CRC generator illustrated in FIG. 1 is provided by a four-bit symbol clock signal 26. If this clock signal 26 has the same period as the changes in the selection signal SEL1, then a delay, represented by X in FIG. 2A, will be present between the check bits stored in the frame check sequence (FCS) for one data frame and the next data frame. However, the SAE High Speed Ring Bus (HSRB) standard requires a frame format having the FCS concatenated with the following data frame as illustrated in FIG. 2B. In order to obtain the required frame format using a single conventional CRC generator, the four-bit symbol clock signal 26 would have to run at a higher frequency than the data is output on bus 24. Since the SAE-HSRB operates at 80 MHz, the four-bit symbol clock signal 26 would have to have a frequency of 40 MHz or faster for some cases depending on the parallelism of output to produce the required frame format illustrated in FIG. 2B. The only conventional way to use a symbol clock signal 26 with a frequency of 20 MHz is to use two overlapped CRC generators.

Figure 3:
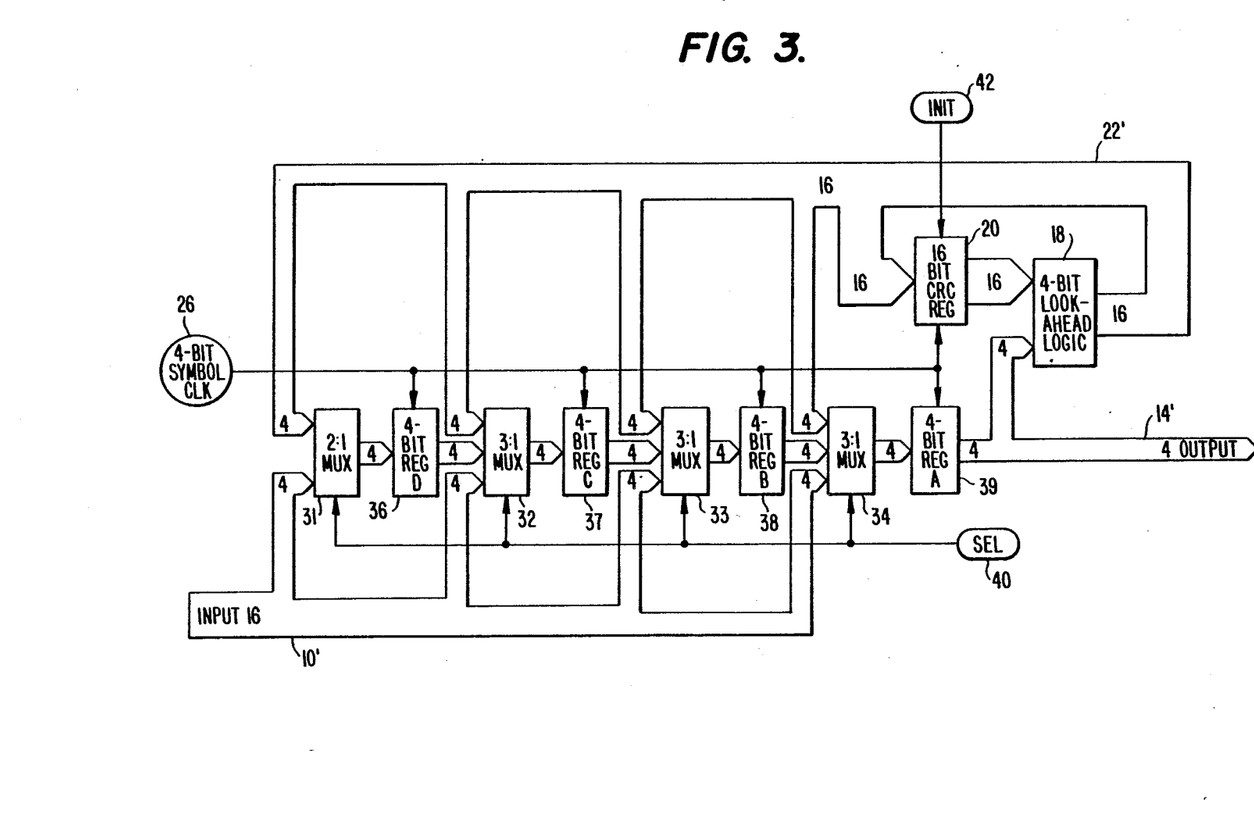
FIG. 3 is a block diagram of a 16-bit CRC generator according the present invention.

An embodiment of a four-bit parallel implementation of a 16-bit CRC generator according to the present invention is illustrated in FIG. 3. The four-bit look-ahead logic 18 and 16-bit CRC register 20 are constructed in the same manner as in the circuit illustrated in FIG. 1. However the input bus 10' supplies a portion of an input data word to each of a plurality of multiplexers 31-34 in a parallel load operation. A plurality of data registers 36-39 are connected in series with the multiplexers 31-34 with each multiplexer having an output connected to the input of a corresponding data register.

In the embodiment illustrated in FIG. 3, each of the data registers 36-39 stores a four-bit nibble for processing by the four-bit look-ahead logic 18. There are four data registers 36-39 and four multiplexers 31-34 because the input bus 10' transmits a 16-bit word in parallel. However, the present invention is not limited to a particular word size, register size, CRC polynomial or number of registers and multiplexers. The embodiment illustrated in FIG. 3 generates CRC bits for the SAE-HSRB which uses a 16-bit word. Four-bit look-ahead logic was chosen for logic circuit 18 as a satisfactory trade-off between speed and number of gates. However, the circuit illustrated in FIG. 3 is not limited to use with the SAE-HSRB, but can be used with any 16-bit CRC by modifying only the look-ahead logic for the appropriate CRC generator polynomial and adding buffers or multiplexers as necessary if a word size other than 16 bits is used for input or the output is more than four bits in parallel. The same circuit can be extended to work with any length CRC generator polynomial, including other popular 8-bit or 32-bit CRC standards, after modification. For example a 32-bit CRC device will require modification of the look-ahead logic, twice the number of multiplexers and data registers and a 32-bit CRC register rather than the 16-bit CRC register in the described embodiment.

One of the multiplexers, multiplexer 31, has only two inputs, one input receiving a portion, i.e., a nibble, of the input data and the other input receiving a portion or nibble of the updated cyclic redundancy check bits output by the four-bit look-ahead logic circuit 18. The remaining multiplexers 32-34 also receive transmit data stored in a preceding one of the data registers 36-38, respectively, in addition to the portions of the input data and CRC bits.

The logic circuit 18 has an input connected to receive the CRC bits in parallel from the CRC register 20 and the transmit data on the transmit bus 14' which is connected to the output from the last data register 39. The output of the logic circuit 18 is connected via the CRC bus 22' to the input of the CRC register 20 and to one of the inputs of the multiplexers 31-34.

Figure 4A:
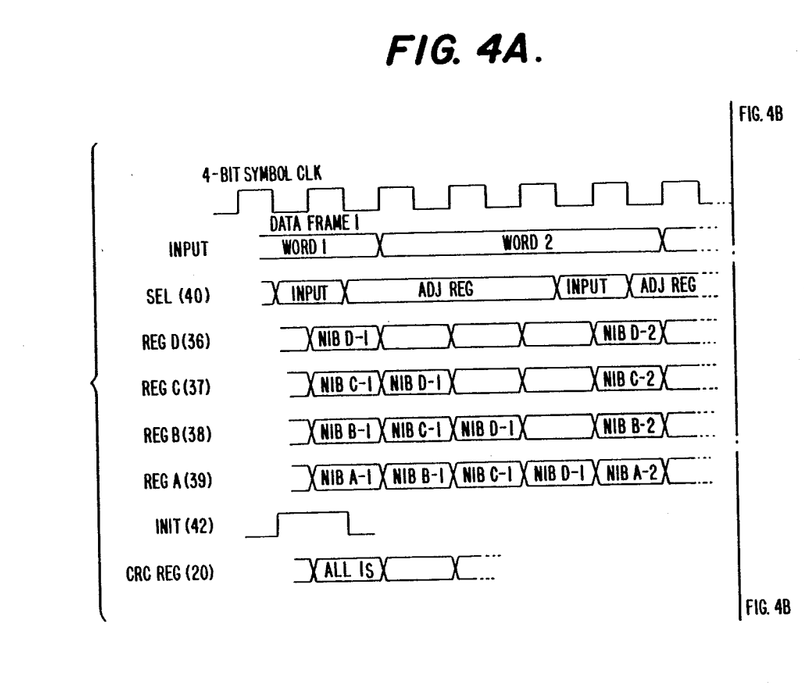
Figure 4B:
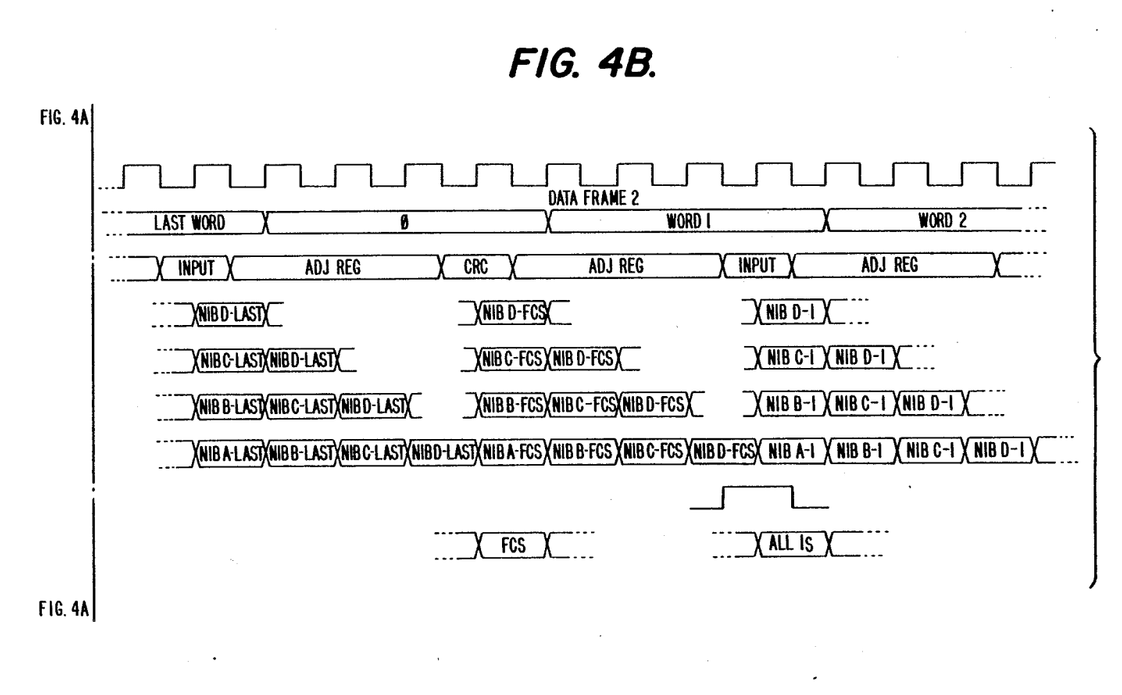

In operation, the CRC register 20 is initialized to all zeros or all ones when the first word of a data frame is parallel loaded into the data registers 36-39 by selecting the lower input of the multiplexers 31-34 using select signal 40. This is illustrated in the timing diagram illustrated in FIG. 4. In the preferred embodiment, the CRC register is initialized to all ones, as indicated in the bottom line of FIG. 4.

Upon completion of the parallel load operation, the first nibble (NIB A-1) of the first word is available for processing by the logic circuit 18 which updates the CRC bits output from the CRC register 20 and supplies the updated CRC bits for storage in CRC register 20. This occurs when the four-bit signal clock signal 26 is generated to control storage of the updated CRC bits in the CRC register 20 and to control a shift operation of the data registers 36-39. As illustrated in FIG. 4, at the end of the shift operation, the next nibble (NIB B-1), is stored in register 39. At this time, the look-ahead logic circuit 18 can update the CRC bits stored in the CRC register 20 in dependence upon nibble (NIB B-1) of the transmit data.

The shift operation is continued until all of the nibbles of the first word of the input data have been supplied to the logic circuit 18 and then the select signal 40 again indicates selection of the input bus 10' to perform another parallel load operation into each of the data registers 36–39 simultaneously via the multiplexers 31–34. This procedure continues as indicated by the dotted lines in FIG. 4 until the last word of a frame is input. When the last nibble (NIB D-LAST) of the last word is stored in register 39, the CRC bits stored in register 20 are updated for the last time by logic circuit 18 and on the next generation of the clock signal 26, the CRC bus 22' is selected for input by the multiplexers 31–34 under the control of select signal 40 as indicated in FIG. 4. As a result, a second parallel load operation into each of the data registers 36–39 is performed when the last word in the frame has just been processed by the logic circuit. This causes the frame check sequence (FCS) or 16 CRC bits to be stored in the data registers 36–39. As a result, the FCS can be output via a shift operation of the data registers 36–39 on the output bus 14', resulting in the frame format illustrated in FIG. 2B.

When the last nibble (NIB D-FCS) of the FCS is stored in data register 39, the CRC register 20 is initialized by an initialization signal 42 to all ones at the next clock signal. The same clock signal also causes the multiplexers 31–34 to perform a parallel load of the first word of the second data frame into data registers 36–39. As a result, the first nibble (NIB A-1) of the first word of the second data frame can be output on output bus 14' immediately behind the last nibble (NIB D-FCS) of the FCS for the first data frame. At the same time, NIB A-1 is supplied to the look-ahead logic 18 to begin generation of the FCS for the second data frame.

Figure 5:
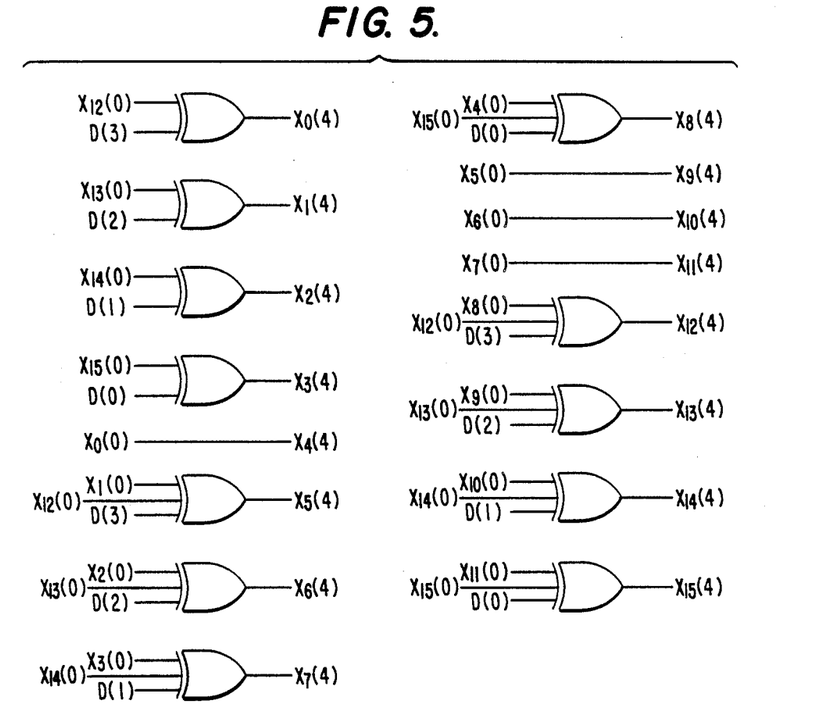
FIG. 5 is a logic diagram of the look-ahead logic used in the CRC generator illustrated in FIG. 3 when the generator polynomial is $X^{16}+X^{12}+X^5+1$.

The precise contents of the look-ahead logic 18 is determined by the generator polynomial and the number of bits of the input word being processed in parallel. In the preferred embodiment, the CRC-CCITT polynomial $X^{16}+X^{12}+X^5+1$ is used and four bits are processed in parallel. Using the procedure described in the *System Design Handbook* article, the gate structure illustrated in FIG. 5 can be designed for the four-bit look-ahead logic circuit 18. In FIG. 5, $X_i(0)$ represents the CRC bits stored in the CRC register 20 where the subscript i is the bit in the CRC word with zero the lowest order bit and 15 the highest order bit. $X_i(4)$ represents the updated CRC bits and D(i) represents the four-bit nibble of input data stored in register 39. The gates are all exclusive OR gates.

The present invention is not limited to a four-bit look-ahead logic circuit having gates with inputs and outputs defined as illustrated in FIG. 5. Rather, FIG. 5 is provided only as an example of logic that can be used. One of ordinary skill in the art can provide other logic circuits for other generator polynomials or to process fewer or more bits in parallel, using the procedure described in the *System Design Handbook* article, incorporated herein by reference.

Figure 6A:
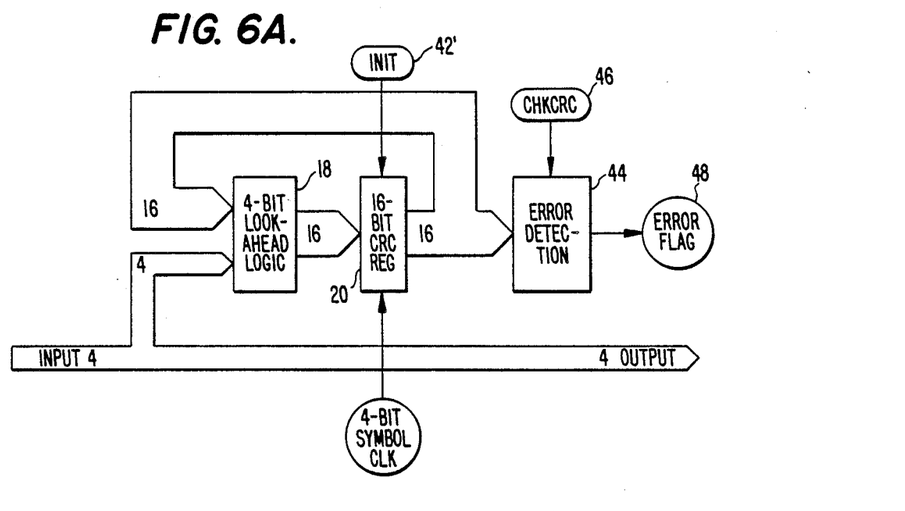
FIGS. 6A and 6B are CRC checkers corresponding to the conventional CRC generator illustrated in FIG. 1 and the CRC generator of the present invention illustrated in FIG. 3, respectively.
Figure 6B:
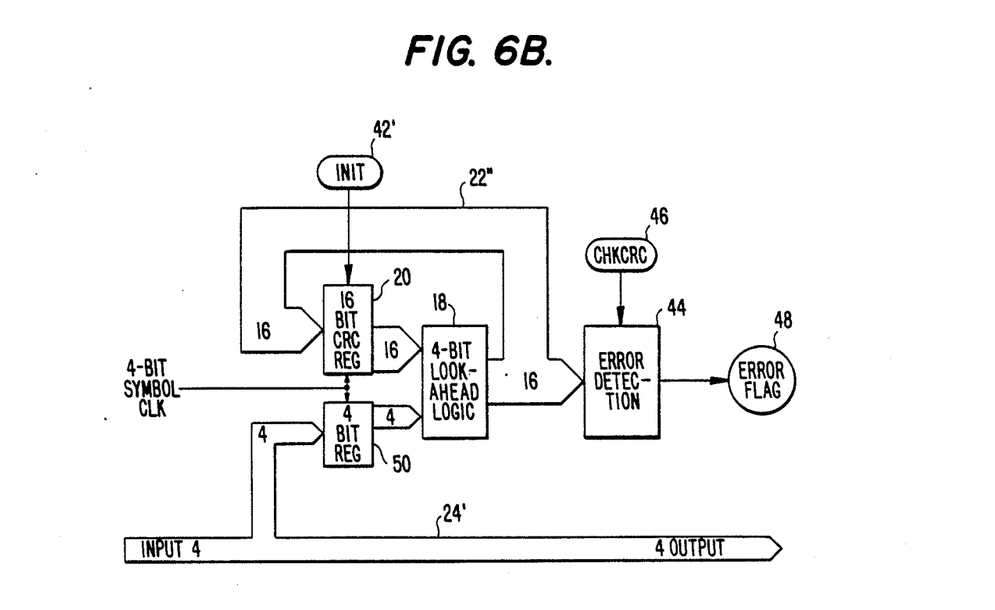

Essentially the same construction is used for a CRC checker as is used for a CRC generator. FIGS. 6A and 6B are illustrations of a conventional CRC checker and a CRC checker according to the present invention, respectively. A multiplexer or buffer for input is not illustrated in FIGS. 6A and 6B and since the FCS does not have to be added to the data stream, there is no multiplexer 16. In place of the multiplexer 16 is error detection logic 44 which receives the CRC check bits from the CRC register 20 and compares the CRC bits with a predetermined value when a CHKCRC signal 46 is generated. If the CRC register 20 is initialized by signal INIT 42' to all zeros, the predetermined value is zero. If the CRC register 20 is initialized to all ones, as in the preferred embodiment, the predetermined value varies depending upon the generator polynomial used. If the CRC bits do not coincide with the predetermined value when CHKCRC is generated, an error flag 48 is output from the error detection circuit 44 for the selected CCITT CRC generator polynomial.

According to the present invention, the connection of the four-bit look-ahead logic 18 and CRC register 20 is the same in the CRC checker illustrated in FIG. 6B as in the CRC generator illustrated in FIG. 3. The output data on data bus 24' is supplied to a four-bit data register 50 which corresponds to data register 39 in the CRC generator. In fact, an integrated circuit chip constructed to perform the function of the CRC generator illustrated in FIG. 3 can be used for the CRC checker illustrated in FIG. 6B with the multiplexer 34 always selecting the input data and the output from the multiplexer 34 corresponding to bus 24' in FIG. 6B. In this case, all that is necessary is to add error detection circuit 44 connected to the CRC bus 22' as indicated by the labeling of bus 22" in FIG. 6B.

Figure 7:
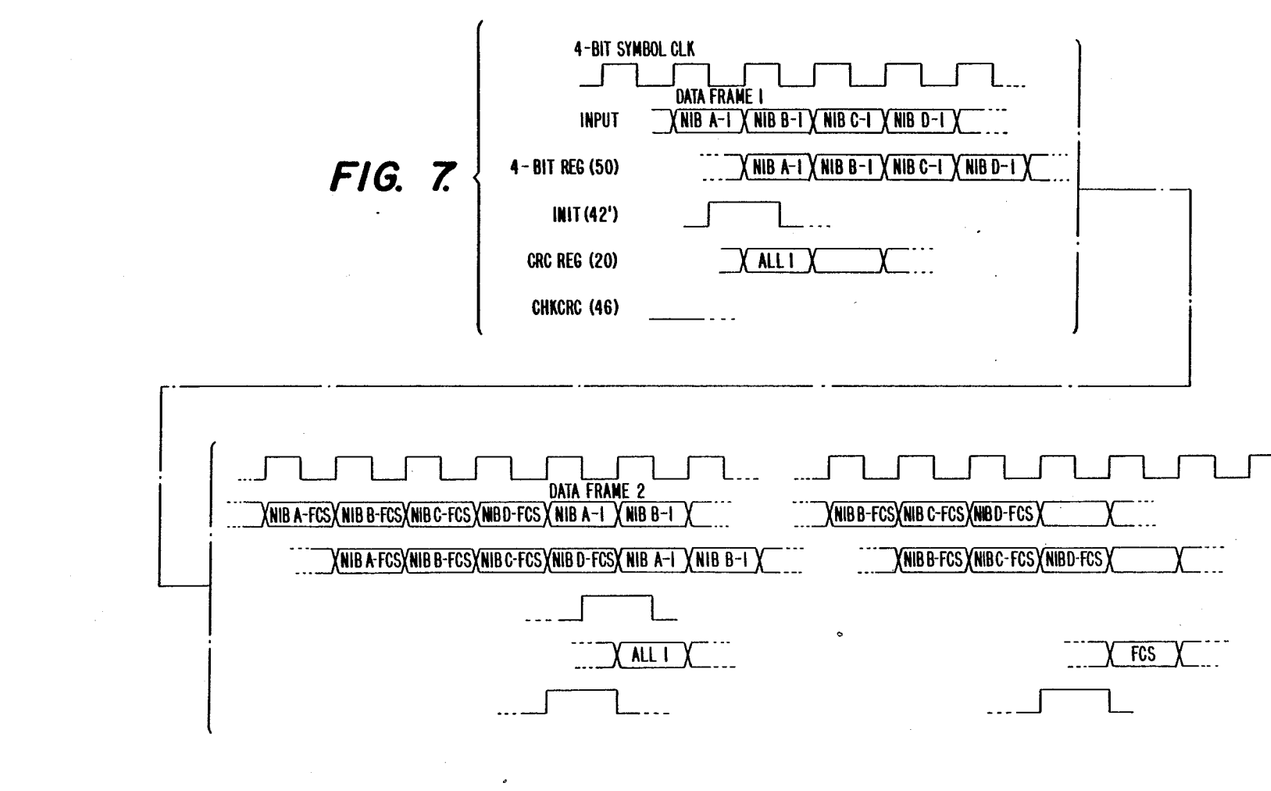
FIG. 7 is a timing diagram for the CRC checker illustrated an FIG. 6B.

The error detection circuit 44 in FIG. 6B receives the updated cyclic redundancy check bits from the look-ahead logic 18 and provides an error indication 48 when the updated cyclic redundancy check bits, generated by the logic circuit 18 after processing the last word of the frame, fail to coincide with the predetermined value. Since the error detection circuit 44 is enabled only when the CHKCRC signal 46 is generated, the error detection circuit 44 may be included in a chip used for the CRC generator without ever being enabled if the signal is not received on the line corresponding to the CHKCRC signal 46. The timing in the CRC checker illustrated in FIG. 6B is similar to that of the CRC generator. Therefore, the timing diagram for the CRC checker which is illustrated in FIG. 7 will not be described in detail.

Figure 8:
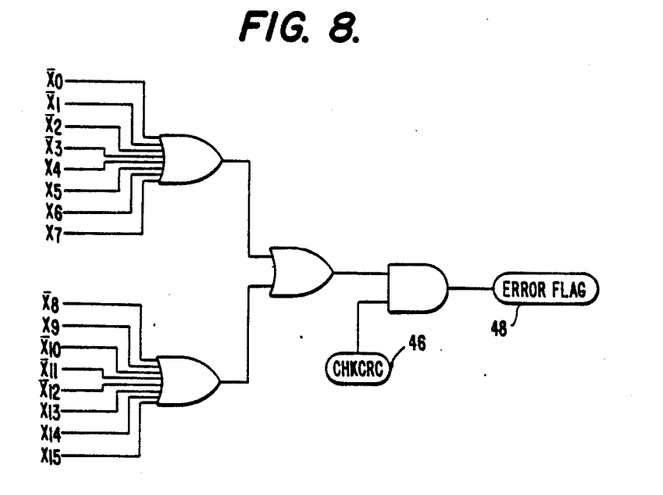
FIG. 8 is a logic diagram of the error detect logic in the CRC checker illustrated in FIG. 6B.

As indicated above, in the preferred embodiment, the CRC register 20 is initialized to all ones. As a result, the first four, ninth and eleventh through thirteenth bits (starting from the lowest order bit $X_0$) of the CRC bits (in the CRC register after the FCS has been processed) should all be one and the remaining bits should all be zero. Thus, the logic diagram illustrated in FIG. 8 represents logic gates that can be used in the error detection circuit 44 for the selected CCITT CRC generator polynomial.

The many features and advantages of the present invention are apparent from the detailed specification and thus, it is intended by the appended claims to cover all such features and advantages of the apparatus which fall within the true spirit and scope of the invention. Further, since numerous modifications and changes will readily occur to those skilled in the art, it is not desired to limit the invention to the exact construction and operation illustrated and described. Accordingly, all suitable modifications and equivalents may be resorted to falling within the scope and spirit of the invention.

What is claimed is:

1. A cyclic redundancy check generator for generating cyclic redundancy check bits for each frame of input data composed of a plurality of words, said generator comprising:
   data register means, having a first parallel input operatively connected to receive the input data and having a second parallel input and a parallel output, for storing transmit data to be output from said cyclic redundancy check generator;

cyclic redundancy check register means, having a parallel input and a parallel output, for storing the cyclic redundancy check bits; and logic means, having an input operatively connected to the parallel outputs of said data register means and said cyclic redundancy check register means and an output operatively connected to the second parallel input of said data register means and the parallel input of said cyclic redundancy check register means, for generating updated cyclic redundancy check bits in parallel in dependence upon the transmit data from said data register means and the cyclic redundancy check bits from said cyclic redundancy check register means, for supplying the updated cyclic redundancy check bits to said cyclic redundancy check register means for storage therein and for supplying the updated cyclic redundancy check bits to said data register means for storage therein after generating the updated cyclic redundancy check bits for the last word in each frame of the input data.

2. A cyclic redundancy check generator as recited in claim 1, wherein said cyclic redundancy check register means has data transfer connections solely to said logic means.

3. A cyclic redundancy check generator as recited in claim 1, wherein said data register means stores the updated cyclic redundancy check bits as the transmit data after outputting the last word in each frame of the input data.

4. A cyclic redundancy check generator as recited in claim 3, wherein said cyclic redundancy check register means includes initialization means for resetting the cyclic redundancy check bits to one of all zeros and all ones when a first word in a new frame is received by said data register means.

5. A cyclic redundancy check generator as recited in claim 1, wherein said data register means comprises:

a first multiplexer having a first parallel input operatively connected to receive a first portion of the input data, a second parallel input operatively connected to said logi means to receive a first portion of the updated cyclic redundancy check bits and a parallel output for outputting the first portion of one of the input data and the updated cyclic redundancy check bits as first selected data;

a first register, operatively connected to said first multiplexer to receive the first selected data, for storing first register data;

a second multiplexer, operatively connected to receive a second portion of the input data, to said logic means to receive a second portion of the updated cyclic redundancy check bits and to said first register to receive the first register data, for outputting one of the second portion of the input data, the first register data and the second portion of the updated cyclic redundancy check bits as second selected data;

a second register, operatively connected to said second multiplexer and said logic means, for storing the second selected data as the transmit data for supplying the transmit data to said logic means and for outputting the cyclic redundancy check bits from said cyclic redundancy check generator as part of the transmit data.

6. A cyclic redundancy check generator as recited in claim 5, wherein said data register means further comprises third and fourth multiplexers and third and fourth registers connected in series between said first register and said second multiplexer, said third and fourth multiplexers operatively connected to receive third and fourth portions of the input data and to said logic means to receive the updated cyclic redundancy check bits, said third multiplexer also operatively connected to receive the first selected data and outputting one of the third portion of the input data, the third portion of the cyclic redundancy check bits and the first selected data as third selected data to said third register, said fourth multiplexer outputting one of the fourth portion of the input data, the fourth portion of the cyclic redundancy check bits and the third selected data, received from said third register, as fourth selected data to said fourth register, wherein said second multiplexer receives the first register data, the third selected data and the fourth selected data via said third and fourth multiplexers and said third and fourth registers in a shift operation of said first, second, third and fourth registers, and wherein said cyclic redundancy check generator further comprises signal means for providing clock signals for controlling the shift operation of said first, second, third and fourth registers and the output of the cyclic redundancy check bits from said cyclic redundancy check register means to said logic means, for providing a selection signal for controlling data selection in said first, second, third and fourth multiplexers and for providing an initialization signal to said cyclic redundancy check register means for initializing the cyclic redundancy check bits when a first word in a new frame is received by said first, second, third and fourth registers.

7. A cyclic redundancy check generator as recited in claim 5, further comprising means for controlling a shift operation of said first and second registers to output from said second register multiple frames of data and cyclic redundancy check bits concatenated together without any space or time delay therebetween.

8. A cyclic redundancy check generator as recited in claim 1, further comprising error detection means, operatively connected to said logic means to receive the updated cyclic redundancy check bits therefrom, for providing an error indication when the updated cyclic redundancy check bits generated by said logic means after processing the last word of the frame fail to coincide with a predetermined value.

9. A cyclic redundancy check generator for generating cyclic redundancy check bits for a frame of data composed of a plurality of words each containing at least eight bits, said cyclic redundancy check generator comprising:

a plurality of multiplexers and data registers connected in series, each of said multiplexers having an output connected to the input of a corresponding data register and an input receiving portions of input data and the cyclic redundancy check bits, each of the portions containing at least four bits received in parallel, each of said data registers outputting transmit data, one of said multiplexers receiving only the portions of the input data and the cyclic redundancy check bits and the at least one remaining multiplexer also receiving the transmit data from a preceding one of said data registers;

a cyclic redundancy check register having an input connected to receive the cyclic redundancy check bits in parallel and having an output for outputting the cyclic redundancy check bits in parallel;

a logic circuit having inputs connected to receive the cyclic redundancy check bits from said cyclic redundancy check register and the transmit data from one of said data registers and having an output connected to the input of said cyclic redundancy check register and each of said multiplexers, for updating the cyclic redundancy check bits in dependence upon the portions of the input data received as the transmit data from the one of said data registers; and signal means for providing a clock signal to said data registers and said cyclic redundancy check register to control the storage of the transmit data and the cyclic redundancy check bits therein, for providing a select signal to control said multiplexers to initially select the portions of the input data for a first parallel load operation into each of said data registers simultaneously, to subsequently select in the at least one remaining multiplexer the transmit data from a preceding one of said data registers for storage in the corresponding register until all of the portions of one word of the input data have been supplied to said logic circuit and then again selecting the input data unless the last word of a frame has just been processed by said logic circuit and to select the portions of the cyclic redundancy check bits in a second parallel load operation into said data registers when the last word in the frame has just been processed by said logic circuit and for providing an initialization signal to initialize said cyclic redundancy check register when the first parallel load operation for the first word of each frame is performed, whereby the one of said data registers connected to said logic circuit outputs at least two consecutive frames of the input data separated only by the cyclic redundancy check bits for an immediately preceding one of the frames.

10. A cyclic redundancy check generator as recited in claim 9, further comprising data supply means for supplying the input data to said multiplexers, the input data having a word length evenly divisible by four.

* * * * *